United States Patent [19]

Seiler

[11] 4,263,562
[45] Apr. 21, 1981

[54] HIGH INPUT IMPEDANCE TRANSISTOR AMPLIFIER

[75] Inventor: Hartmut Seiler, Reutlingen, Fed. Rep. of Germany

[73] Assignee: Robert Bosch GmbH, Stuttgart, Fed. Rep. of Germany

[21] Appl. No.: 63,411

[22] Filed: Aug. 3, 1979

[30] Foreign Application Priority Data

Aug. 3, 1978 [DE] Fed. Rep. of Germany ....... 2833996

[51] Int. Cl.³ .............................................. H03F 3/04
[52] U.S. Cl. .................................... 330/257; 330/288
[58] Field of Search ................................. 330/257, 288

[56] References Cited

U.S. PATENT DOCUMENTS

| 3,714,600 | 1/1973 | Kuijk et al. | 330/288 |
| 3,987,368 | 10/1976 | Ahmed | 330/257 |
| 4,007,427 | 2/1977 | Leidich | 330/257 |

Primary Examiner—Davis L. Willis
Assistant Examiner—T. N. Grigsby
Attorney, Agent, or Firm—Frishauf, Holtz, Goodman & Woodward

[57] ABSTRACT

A first current source injects an emitter bias current into a base-controlled amplifier transistor. A reference transistor identical to the amplifier transistor is connected to the battery to operate independently of the amplifier transistor. A second constant current source identical to the first injects the same emitter bias current into the reference transistor circuit. A circuit interconnects the bases of the reference and amplifier transistors so that the base current supplied to the amplifier transistor is identical to that drawn by the reference transistor to sustain the flow of emitter bias current. The amplifier transistor then offers a high input impedance to a signal source connected to its base.

7 Claims, 6 Drawing Figures

HIGH INPUT IMPEDANCE TRANSISTOR AMPLIFIER

The present invention relates to transistor amplifier circuits which are fed from high impedance sources and therefore require a high input impedance. In particular, it relates to base-controlled transistor amplifiers in which the base current drawn by the amplifier should be limited so as to constitute a relatively small load on the signal source.

BACKGROUND AND PRIOR ART

A particular area of application for the present invention is in transistor amplifiers used in exhaust gas detectors in a motor vehicle. In a known system of this type, disclosed in DT AS No. 21 08 550, the effective input impedance of the transistor amplifier is increased by connecting a reference transistor identical to the amplifier transistor into the collector circuit of the latter. The base current drawn by the reference transistor is applied by means of a so-called "mirror" circuit to the base of the amplifier transistor thereby decreasing the load on the signal source by a factor (B+1) where B is the current amplification of the amplifier transistor (and therefore of the reference transistor).

The main disadvantage of this known transistor amplifier is that the input voltage may not be smaller than the minimum voltage required for causing the emitter-base diode of the transistor in the "mirror" circuit which conducts the base current to be conductive. If the input voltage is less than that, the amplifier does not respond at all. The input voltage must be even larger than the above-mentioned amount if the amplification of the input signal is to be distortionless. This greatly decreases the number of applications for the known transistor amplifier.

THE INVENTION

It is an object of the present invention to furnish a transistor amplifier circuit which has a high input impedance and which can nonetheless amplify substantially without distortion input signals which differ only slightly from the reference potential. In particular, the transistor amplifier according to the present invention is to have a sufficiently high input impedance that it can readily be used in conjunction with a signal source furnishing a voltage of small amplitude and having, simultaneously, a high internal impedance. It is a further object of the present invention to supply a transistor amplifier circuit which can be manufactured as a monolithic integrated circuit in which not only the actual amplifier transistor but also the reference transistor identical thereto can be substrate transistors. The higher current amplification of such transistors is particularly useful for the present invention, as is the fact that transistors on a single chip are readily matched and have the same temperature variations.

It is a further object of the present invention to furnish a transistor amplifier which is readily usable as a difference amplifier or as a preamplifier in a multistage amplifier used, for example, in comparators and operational amplifiers which compare an input signal to a reference potential which differs only slightly from the supply voltage and/or in which only particularly small input currents can be tolerated. In a multistage difference amplifier, the preamplifiers are often driven with a bias current in order to decrease the portion which they contribute to the offset voltage. It is a further object of the present invention to furnish a circuit which is particularly useful for generating the base current for these preamplifier stages with sufficient accuracy and without limiting the operating range of the difference amplifier.

In accordance with the present invention, a reference transistor substantially identical to the amplifier transistor is connected to the source of electrical energy by connecting means which furnish an independent current path, that is independent of the current drawn by the amplifier transistor. Further, current supply means, such as a transistor, again substantially identical to the current supply means which furnish emitter bias current to the amplifier transistor, are connected to the reference transistor and furnish a reference emitter current equal to the emitter bias current thereto. A "mirror" circuit is provided which is connected to the base of the amplifier transistor and of the reference transistor and furnishes a base current equal to the base current of the reference transistor to the amplifier transistor. This base current is the current required to sustain the emitter bias current so that the input impedance presented to the signal source connected to the base of the amplifier transistor is high.

DRAWINGS ILLUSTRATING PREFERRED EMBODIMENTS

FIG. 3 is a schematic diagram of a difference amplifier constructed of two amplifiers according to FIG. 2a;

Figure 1:
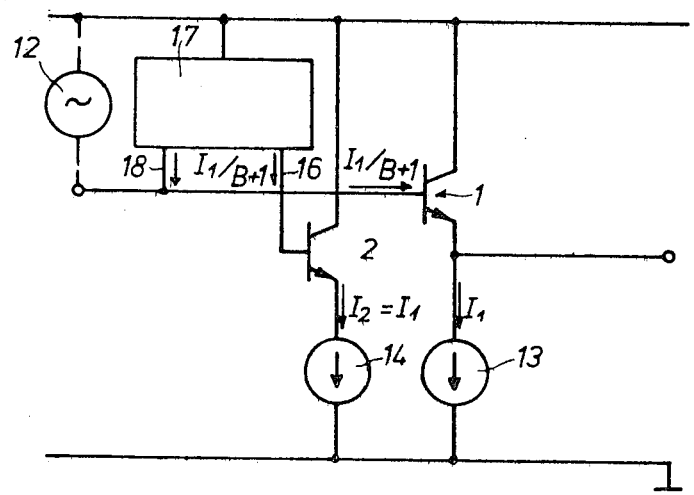
FIG. 1 is a block diagram showing the basic circuit of the present invention.

The transistor amplifier circuit of FIG. 1 shows a first transistor 1 connected as an emitter follower. A voltage signal source 12 is connected to the base 11 of transistor 1. A current source 13 is connected into the emitter circuit of transistor 1 and injects an emitter bias current $I_1$ into the circuit. A base current $I_B$ must be provided in order to allow this emitter current to flow. The value of the current $I_B$ must be $I_1/B+1$ where B is the collector current gain. It is assumed that signal source 12 is a high impedance source which should be loaded as little as possible. The base current $I_1/B+1$ required to generate emitter bias current $I_1$ in the quiescent state, that is with no signal being applied to the circuit, is therefore to be supplied at once to the base of transistor 1. For this purpose, a reference transistor 2 also connected as an emitter follower is provided. The characteristics of transistor 2 are to be as identical to those of transistor 1 as possible. A current source 14 is connected in the emitter circuit of transistor 2. Current source 14 is to have the same characteristics as current source 13 which injects emitter bias current into transistor 1. The current injected into each emitter circuit has a value $I_1$ so that the base current $I_B$ of the second transistor has the value $I_1/B+1$. This base current $I_B$ of transistor 2 is applied to the input 16 of a "mirror" circuit 17 (herein also referred to as additional circuit means). Output 18 of mirror circuit 17 furnishes a current of the same amplitude, namely $I_1/B+1$ to the base 11 of transistor 1. The second transistor thus constitutes a reference transistor whose base current is applied via mirror circuit 17 to transistor 1.

The injection of base current $I_1/B+1$ into transistor 1 results in an increase in the input impedance of this transistor amplifier and therefore in a better matching to the high impedance signal source. It should be noted that the input impedance is higher the closer reference transistor 2 is matched to amplifier transistor 1 and the closer the value of base current transferred to amplifier transistor 1 approaches the value of the base current of reference transistor 2.

Figure 2A:
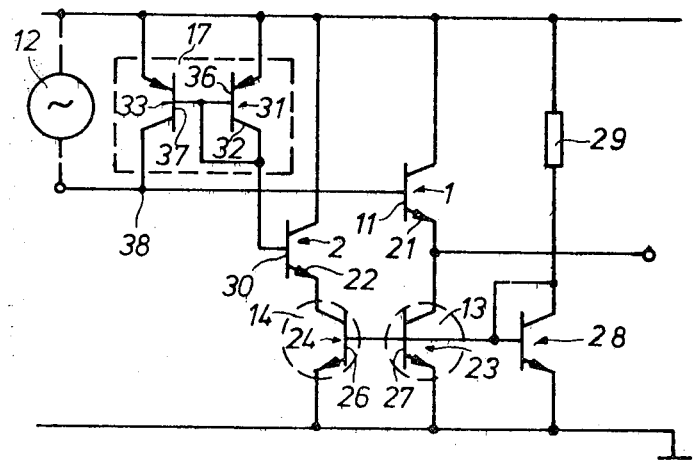
FIG. 2a is a preferred embodiment of the transistor amplifier of FIG. 1 with an input signal referenced to the positive supply voltage and using an npn transistor as amplifier transistor.

FIG. 2a is a more detailed circuit diagram of the circuit shown in general terms in FIG. 1. Here, amplifier transistor 1 and reference transistor 2 are npn transistors. Two identical npn transistors 23 and 24 are used as current sources 13 and 14. The emitters of transistors 23 and 24 are connected to ground potential while the collector of transistor 23 is connected to the emitter 21 of amplifier transistor 1 and that of transistor 14 is connected to the emitter 22 of reference transistor 2. The same base-emitter bias voltage is applied to bases 26 and 27 so that current sources 13 and 14 supply the same current. The amplitude of the current is fixed by resistor 29 and the current source reference transistor 28 in well-known fashion.

The "mirror" circuit 17 includes a first pnp transistor 31 whose collector 32 is connected to the base 30 of reference transistor 2. It also includes a second pnp transistor 33 which is identical to transistor 31. The collector 38 of transistor 33 is connected to the base 11 of amplifier transistor 1. The emitters of transistors 31 and 32 are connected to the positive side of the supply voltage source. The bases 36 and 37 of pnp transistors 31 and 33 are connected to each other and to the collector 32 of pnp transistor 31. The base current for reference transistor 2 is supplied in the main by pnp transistor 31. Since transistors 31 and 33 are identical, pnp transistor 33 carries the same collector current as does transistor 31. Thus a current is injected to base 11 of amplifier transistor 1 via collector 38 of transistor 33 which, for ideal operation of circuit 17 and complete identity between amplifier transistor 1 and reference transistors 2 will have the value $I_1/B+1$. Thus exactly that current is applied to the base of transistor 1 which is required in order to maintain emitter bias current $I_1$. The amplifier transistor 1 does not constitute a load on signal source 12.

Figure 2B:
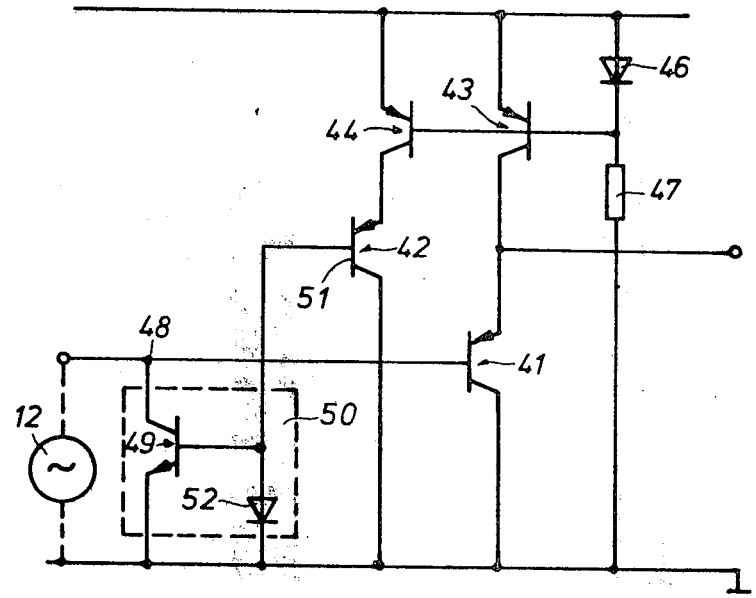
FIG. 2b is an embodiment suitable for use with an input signal referenced to ground potential and using a pnp transistor as amplifier transistor.

The transistor amplifier circuit shown in FIG. 2b is similar in its construction to that of FIG. 2a, the difference being that amplifier transistor 41 and reference transistor 42 are pnp transistors. Correspondingly, the two identical current sources comprising transistors 43 and 44 which receive base bias voltage via a diode 46 and a resistor 47 are also pnp transistors. The output transistor 49 of "mirror" circuit 50 which supplies base current for amplifier transistor 41 at its collector output 48 is an npn transistor. It should be noted that the reference element for "mirror" circuit 50 is a diode. It is connected to the base 51 of reference transistor 42.

While the amplifier shown in FIG. 2a is especially suitable for the processing of input signals which differ only slightly from the positive reference potential of the supply voltage, the amplifier of FIG. 2b is particularly suitable for input signals which differ only slightly from ground potential.

Figure 3:
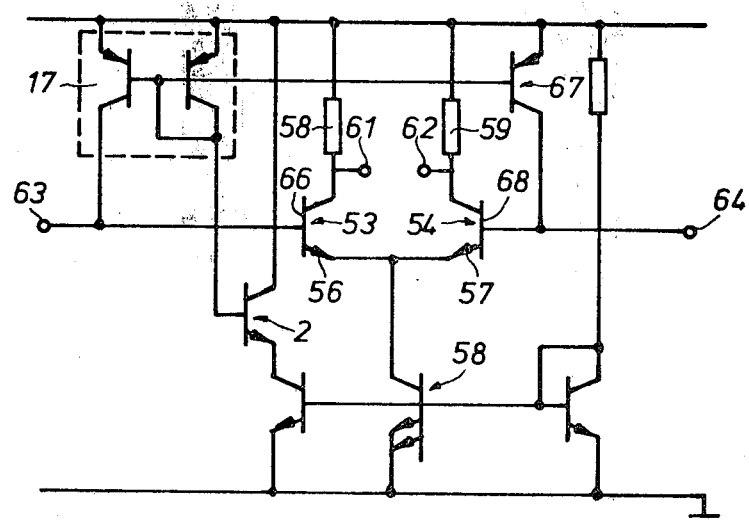

The difference amplifier shown in FIG. 3 is arrived at by substituting two npn transistors 53 and 54 connected to form a difference amplifier for the amplifier transistor shown in FIG. 2b and if, correspondingly, a current source 58 is provided which furnishes twice the emitter current furnished by current source 43 to the emitters 56, 57 connected in common. The output signal from the amplifier can be derived between terminals 61 and 62 at the collectors of transistors 53 and 54, which are connected through resistors 58 and 59 to the positive supply voltage. For the example shown in FIG. 3 it is assumed that the difference amplifier will be connected to a high impedance voltage source at one input, while its other input 64 is connected to a low impedance signal source such as, for example, a battery for furnishing a constant comparison voltage. For this case it suffices to apply the base current of reference transistor 2 through "mirror" circuit 17 only to the base 66 of an npn transistor 53 connected to input 63. The effective input resistance of transistor 53 is therefore increased. If, however, the impedance presented at terminal 64 is also to be a high impedance, the "mirror" circuit can be expanded by a further output transistor 67 so that the base current of reference transistor 2 is also applied to the base 68 of transistor 54. The circuit shown in FIG. 3 is particularly suitable for a small signal difference existing between terminals 63 and 64, that is the difference in input signals should be small relative to the thermal voltage $U_T$ of transistors 53 and 54 so that the base current compensation remains effective.

Figure 4:
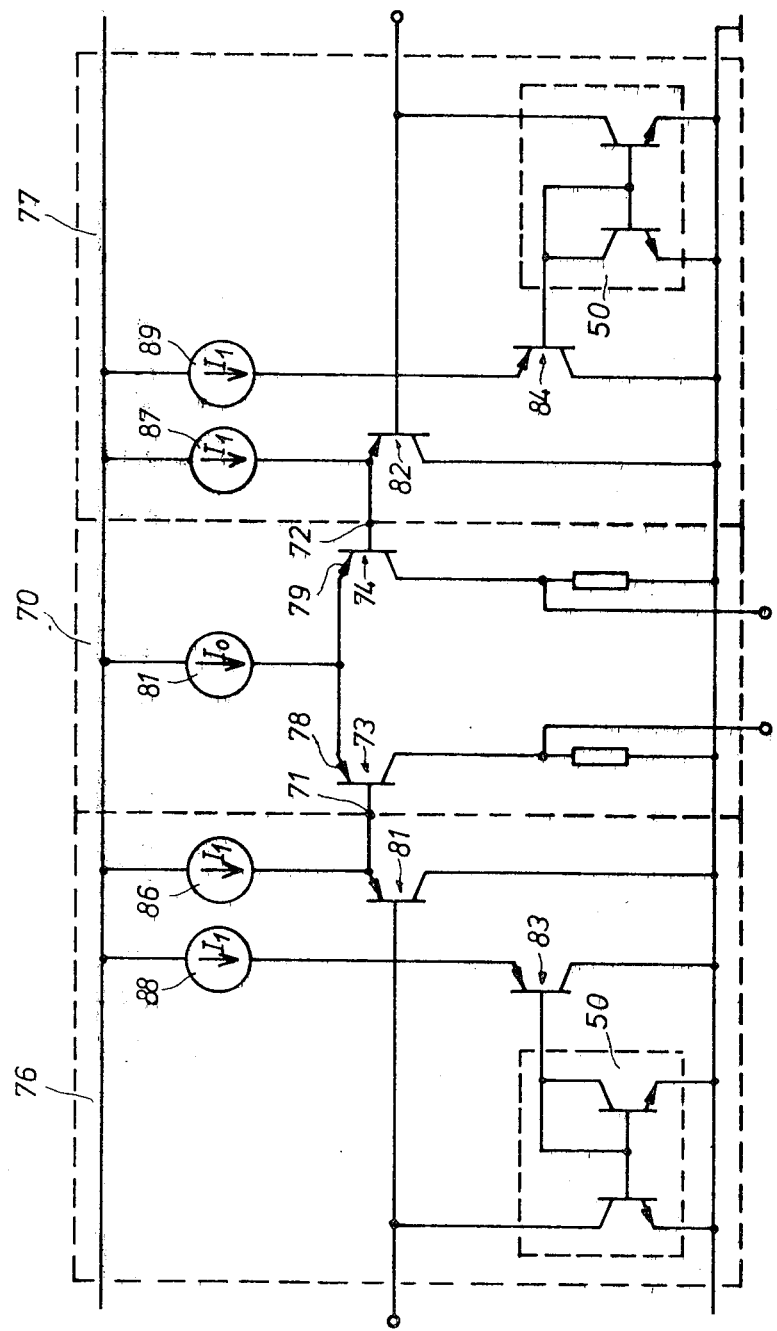
FIG. 4 is a first embodiment of a two-stage difference amplifier having an input stage with input current compensation according to the present invention.

A two-stage difference amplifier is shown in FIG. 4. The output stage 70 is a difference amplifier stage which has input terminal 71 and 72 and comprises two pnp transistors 73 and 74. Each of these transistors is connected to the output of a preamplifier stage, respectively denoted by reference numerals 70 and 77. This results in a difference amplifier with a very high input impedance which is particularly suitable for use in operational amplifiers and comparators.

In the example shown in FIG. 4, an emitter bias current having an amplitude $I_0/2$ is injected into the emitter circuits of each of transistors 73 and 74. Amplifier transistors 81 and 82 and reference transistors 83 and 84 of the preamplifier stages 76 and 77 are each driven with an emitter bias of amplitude $I_1$, which is generated by current sources 86–89.

It is actually not necessary to maintain a predetermined relationship between the bias current $I_1$ with which the transistors 81 and 82 of preamplifiers 76 and 77 are driven to that of the emitter bias current $I_0/2$ with which the transistors 73 and 74 of the difference amplifier stage 70 are energized. However, the amplitude of the emitter bias current $I_1$ with which the preamplifier transistors 81–84 are driven should be substantially larger than the base current resulting from the emitter bias current $I_0/2$ apply to transistors 73 and 74 so that variations of this base current do not result in any considerable changes in the emitter current of transistors 81 and 82 of preamplifier stages 76, 77. Such changes in the emitter current of transistors 81 and 82 would create substantial offset voltages for the difference amplifier.

Figure 5:
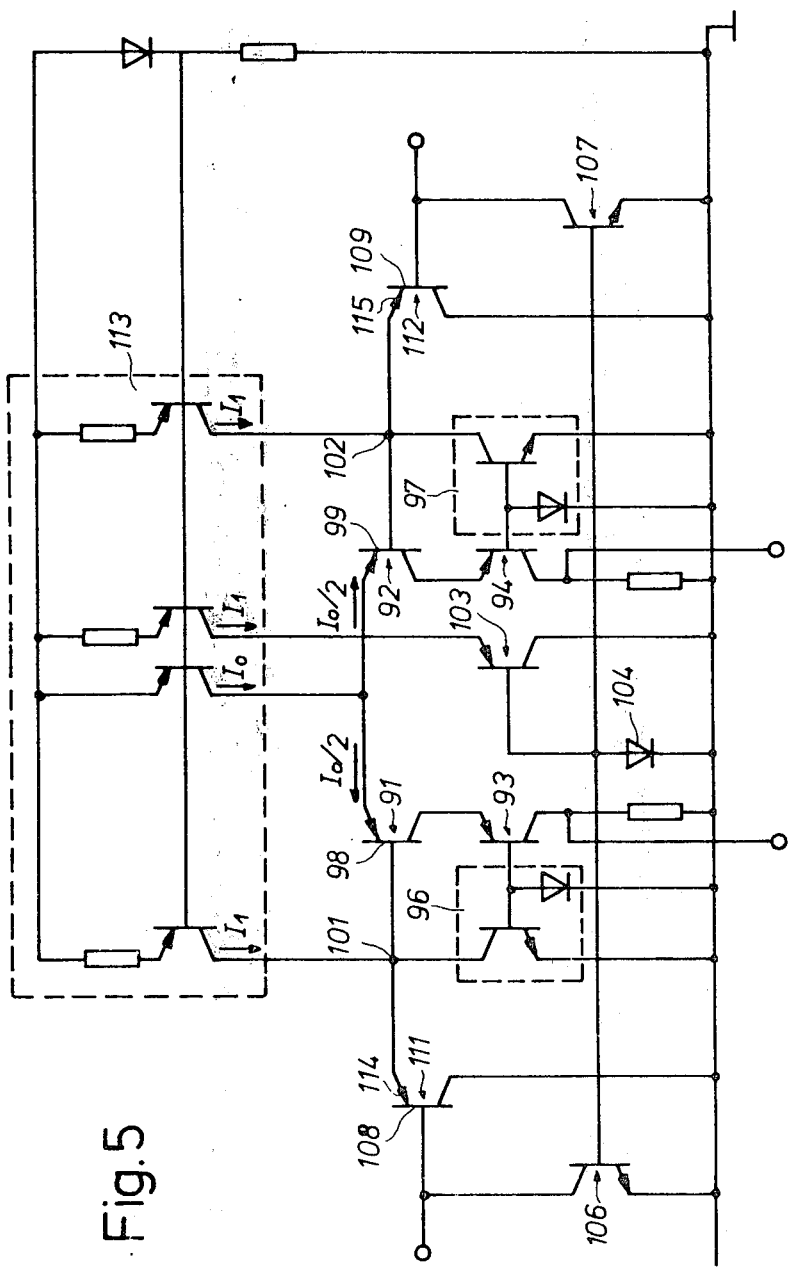
FIG. 5 is a second embodiment of a two-stage difference amplifier with input current compensated preamplifier stages.

FIG. 5 shows another example of a two-stage difference amplifier. However, in FIG. 5 the input impedance of the output stage is also increased by applying a base current to the two pnp transistors 91 and 92. The output of the preamplifier stages is thus also not loaded to any considerable extent. The preamplifier stages shown in FIG. 5 are built up of circuits as shown in FIG. 2a. Reference transistors 93 and 94 are used to supply the base current which is transmitted via "mirror" circuits 96 and 97 to the bases 98 and 99 of transistors 91 and 92. The reference transistors are arranged in the collector circuit of the amplifier transistors. Because of this connection, the output stage can be driven with vastly different signal levels at its inputs 101 and 102 without loading the preamplifier stages. As previously mentioned, the difference amplifier circuit constituted by transistors 91 and 92 can therefore not operate in the direct vicinity of the negative reference potential, but requires at least enough base-emitter voltage to reach its operating point. Since, however, the bases 108 and 109 of transistors 111 and 112 which form the inputs of the two-stage amplifier each are more negative by the required base-emitter voltage than the emitters 114 and 115 which are connected to the bases 98 and 99 of transistors 91 and 92, respectively, the latter transistors receive just the required bias voltage needed to keep the overall amplifier active when the input signals are signals whose level is in the immediate vicinity of the negative side of the energizing voltage.

A simplification relative to the embodiment shown in FIG. 4 is achieved in FIG. 5 in that a single reference transistor 103 is provided for both preamplifier stages. The base current of reference transistor 103 is applied through a "mirror" circuit including a diode 104 and two npn transistors 106 and 107 to the bases 108, 109 of amplifier transistors 111 and 112. The amount of equipment required for current source 113 which injects emitter bias currents $I_1$ and $I_0/2$ is also correspondingly decreased.

The present invention is preferably incorporated into a monolithic integrated circuit. In this type of manufacture, those transistors whose collectors are connected to a fixed potential, as for example amplifier transistors 41, 31, 82, 111, 112 and reference transistors 42, 83, 84, 103 are FIGS. 2b, 4 and 5 can be manufactured as substrate transistors which have a much higher current amplification. It is a further advantage of the present invention that the variation with respect to temperature of injected currents $I_0$ and $I_1$ can be adjusted independently of one another.

Various changes and modifications may be made within the scope of the inventive concepts.

I claim:

1. In a transistor amplifier circuit receiving input signals from a high impedance source (12), said transistor amplifier circuit having a source of electrical energy, an amplifier transistor (1) having an emitter, base, and collector, first connecting means for connecting said amplifier transistor to said source of electrical energy, first current supply means (13) connected to said amplifier transistor for supplying a predetermined emitter bias current thereto, a reference transistor (2) substantially identical to said amplifier transistor and having an emitter, base and collector for creating a reference base current in response to a reference emitter current supplied thereto, and additional circuit means (17) connected to said base of said amplifier transistor and said base of said reference transistor for furnishing an amplifier transistor base current equal to said reference base current to said base of said amplifier transistor:

the improvement comprising second connecting means independent of said first connecting means for connecting said reference transistor to said source of electrical energy; and second current supply means (14) connected to said reference transistor for supplying a reference emitter current equal to said emitter bias current to said emitter of said reference transistor.

2. A transistor amplifier circuit as set forth in claim 1, wherein said amplifier transistor constitutes a preamplifier for a difference amplifier.

3. A transistor amplifier circuit as set forth in claim 1, wherein said amplifier transistor constitutes a first amplifier transistor (53);

further comprising a second amplifier transistor (54) identical to said first amplifier transistor and connected thereto to form a difference amplifier;

wherein said first current supply means is connected to both said first and said second amplifier transistor and furnishes a current equal to twice said emitter bias current; and wherein said additional circuit means further comprises means for furnishing an amplifier transistor base current equal to said reference base current to said second amplifier transistor.

4. A transistor amplifier circuit as set forth in claim 2, wherein said reference transistor constitutes a first reference transistor (83) associated with said preamplifier transistor (81);

wherein said first and second current supply means comprise means (86, 88) for supplying emitter bias current and reference emitter current to said preamplifier transistor and said first reference transistor, respectively;

further comprising third current supply means (80) connected to said difference amplifier for supplying a difference amplifier emitter current thereto; and wherein said emitter bias current supplied to said preamplifier transistor substantially exceeds the base current required in each transistor of said difference amplifier for sustaining said differential amplifier emitter current.

5. A transistor amplifier circuit as set forth in claim 4, wherein said difference amplifier comprises a first (91) and second (92) difference amplifier transistor;

further comprising an additional reference transistor (93) connected in series with said first differential amplifier transistor, and further circuit means (96) connected between said additional reference transistor and said first differential amplifier transistor for supplying a base current equal to the base current drawn by said reference transistor to said first differential amplifier transistor.

6. A transistor amplifier circuit as set forth in claim 1, wherein said circuit is embodied in a monolithic integrated circuit.

7. A transistor amplifier circuit as set forth in claim 6, wherein all amplifier transistors and reference transistors driven by the same emitter bias current are embodied in a substrate of said monolithic integrated circuit.

* * * * *